United States Patent [19]

Criss

[11] Patent Number: 4,964,963

[45] Date of Patent: Oct. 23, 1990

[54] METHOD OF MAKING ARCHITECTURAL COATING WITH INTERFERENCE COLORS

[75] Inventor: Russell C. Criss, Pittsburgh, Pa.

[73] Assignee: PPG Industries, Inc., Pittsburgh, Pa.

[21] Appl. No.: 450,936

[22] Filed: Dec. 15, 1989

Related U.S. Application Data

[62] Division of Ser. No. 682,136, Dec. 17, 1984, Pat. No. 4,902,581.

[51] Int. Cl.$^5$ ............................................. C23C 14/34
[52] U.S. Cl. ........................... 204/192.27; 204/192.26
[58] Field of Search ...................... 204/192.27, 192.26; 428/432

[56] References Cited

U.S. PATENT DOCUMENTS

| | | | |
|---|---|---|---|
| 3,720,541 | 3/1973 | King | 428/216 |
| 4,022,947 | 5/1977 | Grubb et al. | 428/432 |
| 4,327,967 | 5/1982 | Groth | 350/258 |
| 4,462,883 | 7/1984 | Hart | 204/192.26 |
| 4,534,841 | 8/1985 | Hartig et al. | 204/192.26 |

*Primary Examiner*—Aaron Weisstuch
*Attorney, Agent, or Firm*—Donna L. Seidel

[57] ABSTRACT

A transparent article for reflecting solar energy comprising a metal oxide film which exhibits color by absorption and interference effects and a highly reflective metal film is disclosed along with a sputtering method for its production.

7 Claims, No Drawings

METHOD OF MAKING ARCHITECTURAL COATING WITH INTERFERENCE COLORS

CROSS REFERENCE TO RELATED APPLICATION

This application is a division of U.S. application Ser. No. 06/682,136 filed Dec. 17, 1984, by the same inventor, now U.S. Pat. No. 4,902,582.

The present invention relates generally to the art of transparent coatings and more particularly to multiple layer colored transparent coatings, especially for use on architectural glass products.

Architectural glass products with metallic and/or metal oxide films are growing in importance as energy demands for heating and cooling become increasingly expensive. Coated glass architectural products generally fall into two categories, solar energy control and high transmittance, low emissivity coated products.

Solar energy control glass products are generally glass substrates, often tinted, coated with a low visible transmittance colored film which reduces solar energy transmittance through the windows into the building interior, thereby reducing air conditioning costs. These Products are most effective in warm climates and are most often seen in commercial construction. In areas where heating costs are of greater concern, and particularly in residential construction, high transmittance, low emissivity coatings are desirable in order to allow high transmittance of visible light into the interior while reflecting infrared radiation to retain heat inside the building. High transmittance, low emissivity coatings are typically multiple layer films wherein an infrared reflecting metal such as silver, gold or copper is sandwiched between anti-reflective metal oxide layers such as bismuth, indium and/or tin oxides. Solar energy control films, on the other hand, are typically single layer films of one or more of the metals or oxides of metals such as cobalt, iron, chromium, nickel, copper, etc.

Wet chemical methods for producing metallic films for solar energy control are well known from U.S. Pat. Nos. 3,846,152; 4,091,172; 3,723,158 and 3,457,138. Pyrolytic methods for producing metal oxide films for solar energy control are well known from U.S. Pat. Nos. 3,660,061; 3,658,568; 3,978,272 and 4,100,330.

Sputtering technologies for producing high transmittance, low emissivity multiple layer coatings are disclosed in U.S. Pat. Nos. 4,462,884 and U.S. Pat. No. 4,508,789 to Gillery. Sputtering techniques for producing solar control films are disclosed in U.S. Pat. Nos. 4,512,863 and 4,594,137 to Criss and Gillery.

U.S. Patent No. 4,022,947 to Grubb et al discloses a transparent panel capable of transmitting a desired portion of visible solar radiation while reflecting a large portion of incident solar radiation, and a method of preparing same, by sputtering an iron, nickel and chromium alloy to obtain a transparent metal film, and reactively sputtering the same or a similar alloy in the presence of oxygen to form an oxide film. In one preferred embodiment, the metal film lies between the substrate and the metal oxide film. In another preferred embodiment, the metal oxide film lies between the substrate and the metal film.

SUMMARY OF THE INVENTION

The present invention involves a solar energy control film deposited on a substrate such as glass by cathode sputtering, preferably magnetron sputtering. The film comprises a layer of a reflective metal and a layer of a colored metal compound, preferably a metal oxide. The metallic layer provides brightness and reflectivity while the metal oxide layer can be varied in relative thickness to provide a variety of reflected colors by interference effects. In addition, because the metal oxide of the present invention exhibits significant absorption at a particular wavelength, a desired color can be produced with a relatively thin film compared with metal oxides which exhibit interference effects but no significant absorption.

DESCRIPTION OF THE PREFERRED EMBODIMENTS

A transparent substrate, preferably glass, is coated by cathode sputtering, preferably magnetron sputtering, to provide a solar energy control product. The coating comprises at least one layer of a reflective metal, such as gold, copper, aluminum and preferably silver, and at least one layer of a metal compound which can provide color by both absorption and interference effects at various relative thicknesses, such as the oxides and/or nitrides of metals such as iron alloys, nickel alloys, copper, iron and cobalt. A preferred metal compound is an oxide of stainless steel.

In a preferred embodiment of the present invention, a glass surface is first coated with a layer of stainless steel oxide by sputtering a stainless steel cathode target in an oxidizing reactive atmosphere. The stainless steel oxide coated surface is then further coated with a layer of silver by sputtering a silver cathode target in a nonreactive atmosphere such as argon. Preferably, a protective coating is deposited over the silver. In a most preferred embodiment of the present invention, the protective coating is stainless steel deposited by sputtering a stainless steel cathode target in a nonreactive atmosphere such as argon. The relative thicknesses of the coating layers can be varied to yield a variety of reflected colors. While interference colors can be obtained with relatively nonabsorbing materials such as indium oxide or tin oxide, much thicker films are required to produce colors equivalent to those of thinner films of absorbing compounds such as stainless steel oxide. For example, an indium oxide film about 1375 Angstroms thick is required to produce a gold color compared to about 300 to 600 Angstroms for stainless steel oxide. Moreover, the gold reflectance of the stainless steel oxide is more intensely colored due to the absorptance of the stainless steel oxide in the blue wavelength range of the spectrum.

In a most preferred embodiment, stainless steel oxide, silver and stainless steel layers are combined to produce a rich gold colored coating. The present invention will be further understood from the descriptions of specific examples which follow.

EXAMPLE I

A multiple layer coating of stainless steel oxide and silver with a stainless steel protective coating is deposited on a glass substrate under the following conditions, in one pass under multiple cathodes in sequence. A clean glass substrate is maintained in a vacuum chamber in an atmosphere of 50 percent oxygen and 50 percent argon at a pressure of 4 microns. With two stainless steel cathodes powered at 43 kilowatts each and a line speed of 100 inches (2.54 meters) per minute, a stainless steel oxide coating is deposited at a thickness of 300 to 600 Angstroms, decreasing the luminous transmittance of the glass from about 90 percent to about 75 percent. Next, a silver cathode is sputtered in an inert argon atmosphere. With the same line speed and a power of 6 kilowatts, a silver coating about 200 to 250 Angstroms thick is deposited over the stainless steel oxide coating, further reducing the luminous transmittance to about 14 percent. Finally, since an exposed silver film is particularly vulnerable, a very thin protective film is deposited over the silver by sputtering a stainless steel cathode in an inert argon atmosphere. With the same line speed and minimal power of about 1 kilowatt, the stainless steel protective coating is deposited to a thickness of about 10 to 50 Angstroms, resulting in a final luminous transmittance of about 12 percent. The thickness of the protective layer is minimized in order to minimize the decrease in transmittance as well as to minimize any decrease in the reflectivity of the silver layer. The coated article has a bright gold appearance from the glass side resulting from both interference effects and absorption properties of the stainless steel oxide, which absorbs nearly 30 percent at a wavelength of 4000 Angstroms but only about 5 percent at wavelengths of 5500 Angstroms and higher. The stainless steel composition used in this example is the 316 alloy, which comprises about 68 percent iron, 17 percent chromium, 12 percent nickel and 2.25 percent molybdenum. The luminous reflectance of the coated article is 67.7 percent from the coated surface and 52.9 percent from the glass side. The reflected color has dominant wavelengths of 579 and 576 and excitation purities of 15.2 and 42.4 from the coated and glass sides respectively. In a double glazed unit, the coated article provides a shading coefficient of 0.17 and summer and winter U-values of 0.30.

EXAMPLES II-X

Coated articles reflecting various colors ranging from greenish yellow through yellow, yellowish orange, orange, reddish orange and red to purple are prepared by depositing stainless steel oxide, silver and stainless steel as in Example I to various relative thicknesses. While the thicknesses are not measured directly, the transmittances after each sputtering step are indicative of the individual layer thicknesses. The varying thicknesses are obtained by varying the power to the cathode and/or the number of passes under a cathode. In the following table, the transmittances are shown after the deposition of the first layer of stainless steel oxide (SS oxide), after the layer of silver, and after the protective layer of stainless steel (SS). The table also includes the luminous reflectance from the coated side, $R_1$, and the glass side, $R_2$.

TABLE

| Example | % Transmittance | | % Reflectance | | | Color |
|---|---|---|---|---|---|---|
| | SS Oxide | Silver | SS | $R_1$ | $R_2$ | $R_2$ |
| II | 62.1 | 45.0 | 29.4 | 37.4 | 9.5 | Orange |
| III | 55.3 | 40.4 | 28.7 | 40.5 | 6.1 | Red |
| IV | 51.8 | 37.3 | 26.8 | 43.3 | 5.8 | Purple |
| V | 58.2 | 16.1 | 11.4 | 62.9 | 27.6 | Yellowish Orange |
| VI | 62.9 | 17.7 | 13.0 | 62.3 | 34.2 | Yellow |
| VII | 70.0 | 17.6 | 13.3 | 63.6 | 45.9 | Yellow |
| VIII | 77.8 | 21.3 | 12.4 | 78.9 | 62.8 | Greenish Yellow |
| IX | 77.9 | 25.8 | 14.9 | 53.6 | 47.2 | Greenish Yellow |
| X | 78.3 | 16.2 | 14.6 | 51.5 | 46.3 | Gold |

The thinner silver films of Examples II to IV produce high reflectance from the coated side, but thicker silver films of Examples V to IX are preferred to provide high reflectance from the glass side as well.

The above examples are offered only to illustrate the present invention. Various other absorbing metal oxides and nitrides which produce interference colors, such as oxides or nitrides of nickel alloys, copper, iron and cobalt may be used, along with other highly reflective metals such as gold, copper or aluminum. Any suitable transparent protective layer may be employed. The scope of the present invention is defined by the following claims.

I claim:
1. A method of making a solar energy reflecting coated article comprising the steps of:
   a. sputtering stainless steel in an oxidizing atmosphere onto a surface of a substrate to form a first transparent coating which exhibits color by absorption and interference effects; and
   b. sputtering over said film a highly reflective transparent metallic film.
2. A method according to claim 1, wherein said metallic film is deposited by sputtering a metal selected from the group consisting of silver, gold, copper, aluminum and mixtures thereof in an inert atmosphere.
3. A method according to claim 2, wherein silver is sputtered in an atmosphere comprising argon.
4. A method according to claim 3, wherein a transparent protective film is deposited over said silver film, which protective film does not significantly decrease the reflectance of the colored coated article.
5. A method according to claim 4, wherein a transparent protective film comprising stainless steel is deposited over said silver film.
6. A method according to claim 5, wherein the protective film is deposited by sputtering stainless steel in an inert atmosphere.
7. A method according to claim 6, wherein the stainless steel oxide film and stainless steel protective film are both deposited by sputtering of stainless steel comprising about 68 percent iron, 17 percent chromium, 12 percent nickel and 2.25 percent molybdenum.

* * * * *